(12) United States Patent
Song

(10) Patent No.: US 7,252,521 B2
(45) Date of Patent: Aug. 7, 2007

(54) INJECTOR/EJECTOR AND SHELF STRUCTURE GROUNDED TO CARD FRAME GROUND

(75) Inventor: Soo Yong Song, Seoul (KR)

(73) Assignee: UTStarcom Korea Limited, Alameda, CA (US)

( * ) Notice: Subject to any disclaimer, the term of this patent is extended or adjusted under 35 U.S.C. 154(b) by 0 days.

(21) Appl. No.: 10/561,058

(22) PCT Filed: Jul. 26, 2004

(86) PCT No.: PCT/KR2004/001877

§ 371 (c)(1),
(2), (4) Date: Jul. 31, 2006

(87) PCT Pub. No.: WO2005/011348

PCT Pub. Date: Feb. 3, 2005

(65) Prior Publication Data

US 2006/0264077 A1    Nov. 23, 2006

(30) Foreign Application Priority Data

Jul. 25, 2003    (KR) ...................... 10-2003-0051476

(51) Int. Cl.
*H01R 4/66*   (2006.01)

(52) U.S. Cl. ......................................... 439/92; 439/160

(58) Field of Classification Search ............ 439/92, 439/94, 152, 155, 160, 377; 361/800, 785, 361/818; 174/377, 365, 51
See application file for complete search history.

(56) References Cited

U.S. PATENT DOCUMENTS 4,602,835 A * 7/1986 Bauer et al. ................ 439/160
4,699,594 A * 10/1987 Assel et al. ................. 439/152

(Continued)

*Primary Examiner*—James R. Harvey
*Assistant Examiner*—Travis Chambers
(74) *Attorney, Agent, or Firm*—McDonnell Boehnen Hulbert & Berghoff LLP

(57) ABSTRACT

The present invention generally relates to an injector/ejector (in/ejector) and shelf structure grounded to a frame ground of a card, in which electromagnetic and electric waves generated in an electric or electronic device can be conducted outside. More specifically, the present invention comprises: a shelf having a frame, a guide rail and a guide supporter, wherein the frame and the guide rail are established at a given spacing in front and rear portions of upper and lower ends thereof, respectively, in order to provide a framework, and wherein the guide supporter has a common conductivity formed in an inside of both upper and lower parts thereof; a card including a frame ground and a stiffener, wherein the frame ground having conductivity is formed on upper and lower parts thereof, and wherein the stiffener having a rectangular shape is formed on a front part thereof, and wherein the card is mounted on the shelf; and an in/ejector for fixing the card on the shelf, wherein said in/ejector is coupled to upper and lower parts of the stiffener and is grounded to the guide supporter and the frame ground. According to the present invention, communication interference caused by unnecessary electromagnetic waves generated in the electronic device, electric wave of other devices and an external electric wave can be reduced, thereby mitigating the loss of lives and property damage resulting from incorrect operations. Additionally, in conducting radiation test of EMI and static electricity radiation test among the adaptability test of electromagnetic wave for systems, electromagnetic waves can be reduced significantly so that the device can operate normally under static electricity when the frame grounds on various cards are conducted outside.

3 Claims, 5 Drawing Sheets

U.S. PATENT DOCUMENTS 4,894,753 A * 1/1990 Wadell et al. .............. 361/818
5,386,346 A * 1/1995 Gleadall ..................... 361/799
5,793,614 A * 8/1998 Tollbom .................... 361/732
6,134,119 A * 10/2000 Gunther et al. ............. 361/800
6,752,641 B2 * 6/2004 Puri et al. ................... 439/157

* cited by examiner

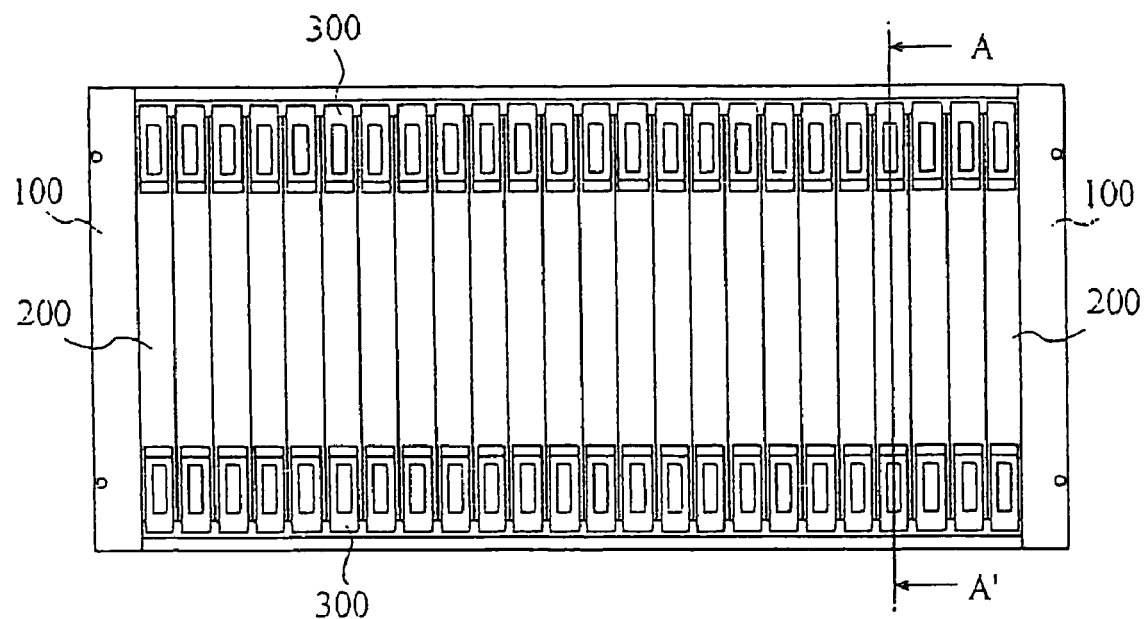
[Fig. 1]

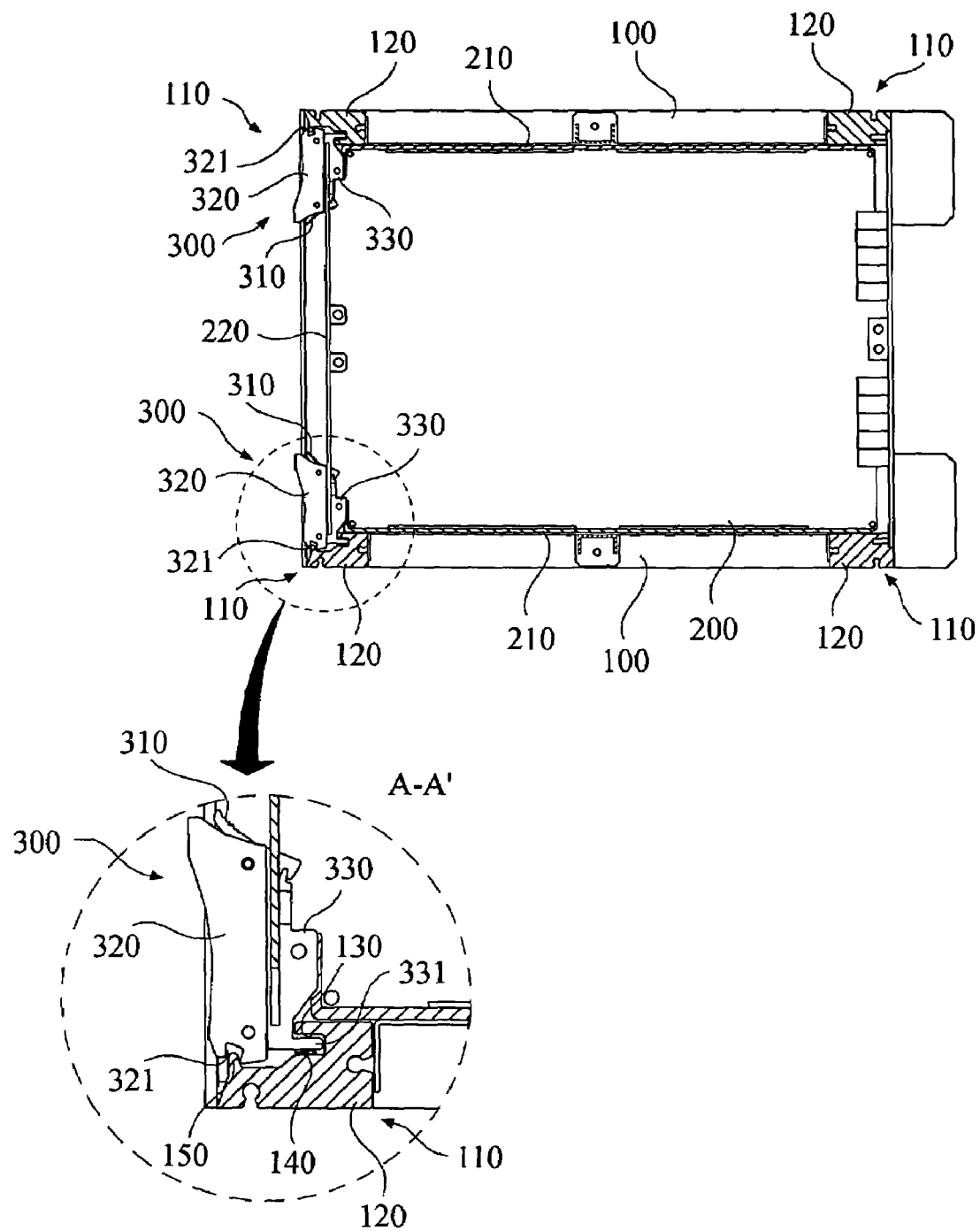
[Fig. 2]

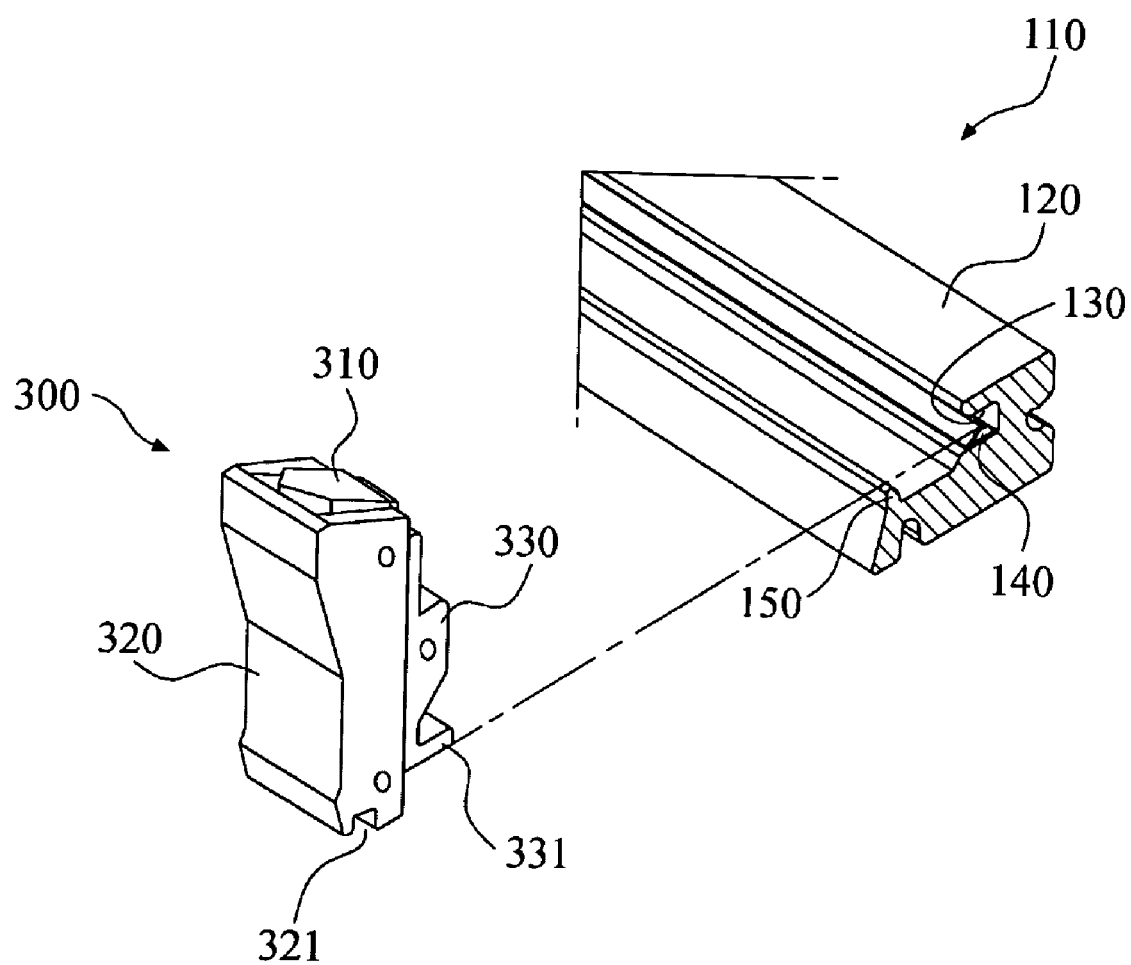
[Fig. 3]

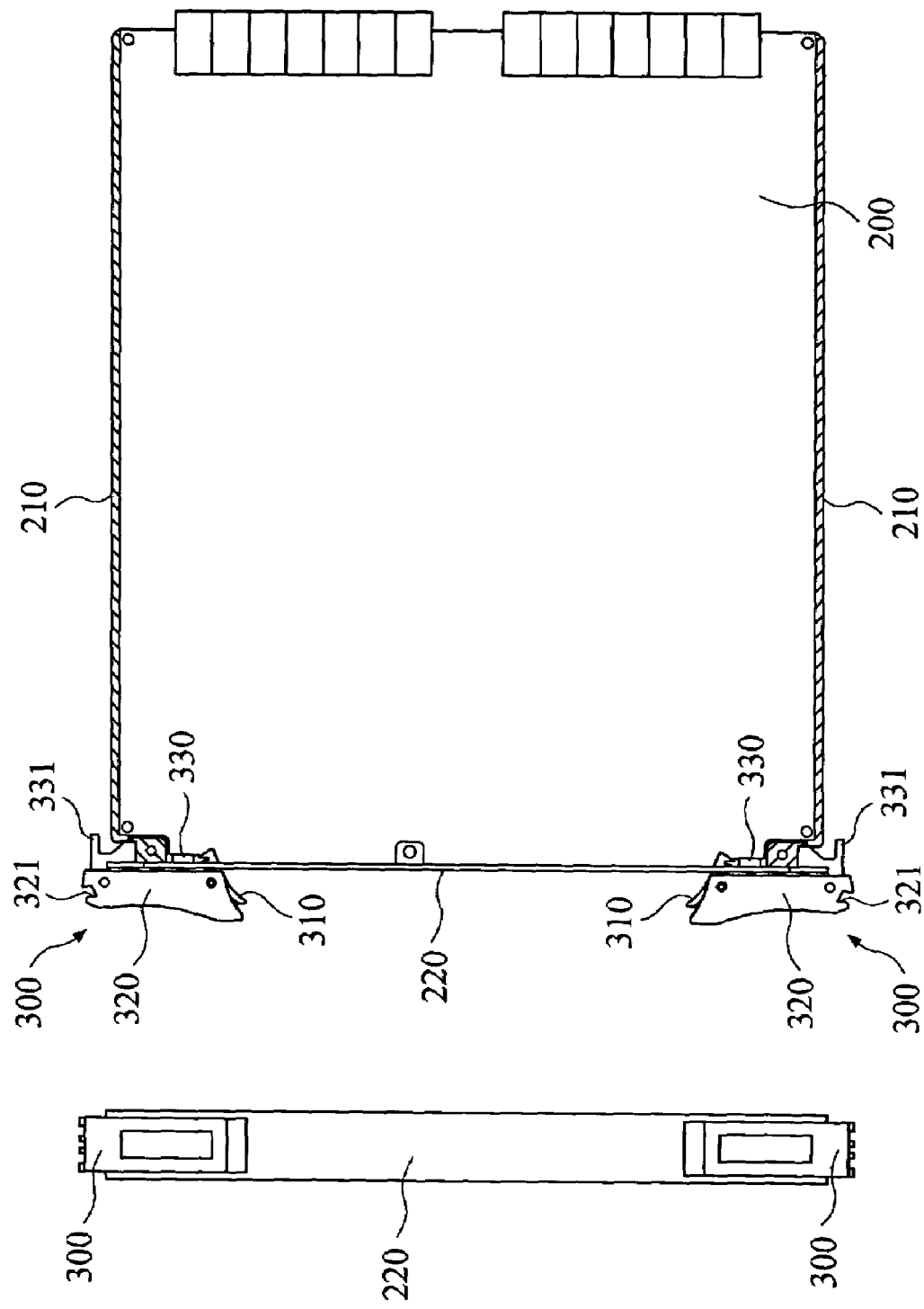

[Fig. 5]
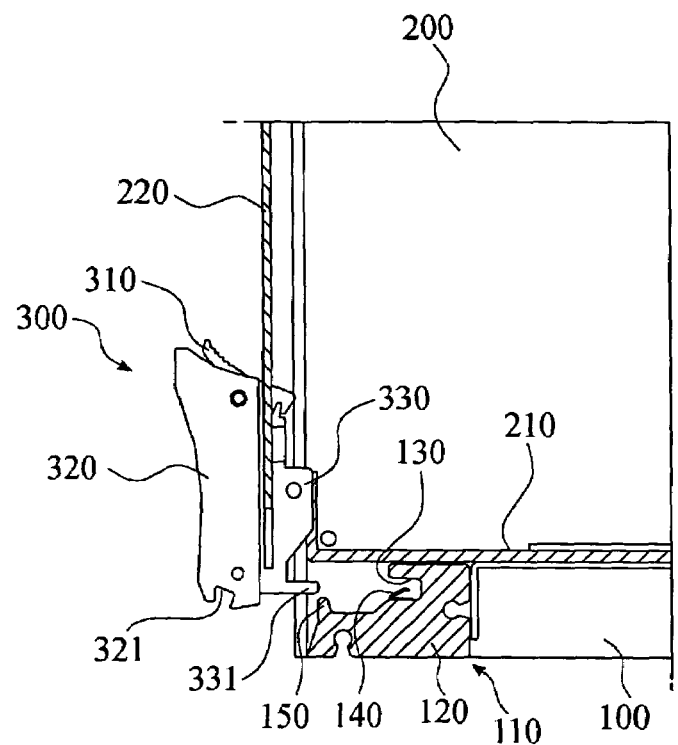
[Fig. 6]
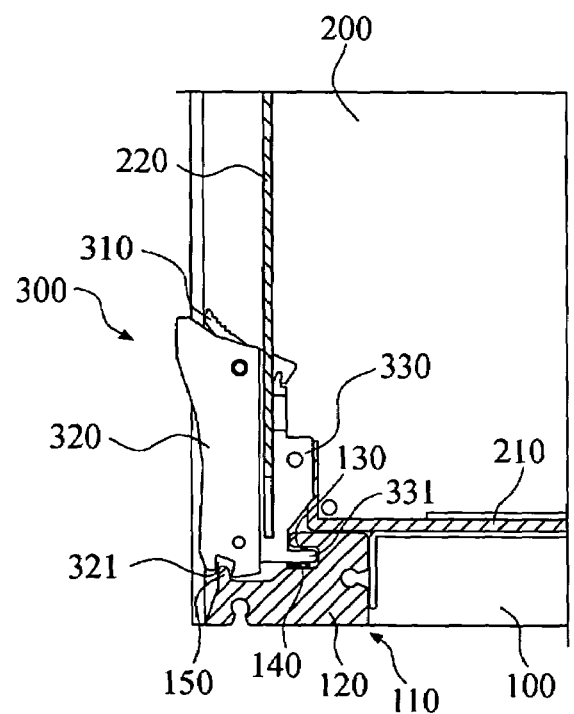

INJECTOR/EJECTOR AND SHELF STRUCTURE GROUNDED TO CARD FRAME GROUND

TECHNICAL FIELD

The present invention generally relates to an injector/ejector (in/ejector) and shelf structure grounded to a frame ground of a card. More particularly, the present invention is directed to an in/ejector and shelf structure in which a frame ground and the in/ejector have conductive materials and are grounded to a shelf, thereby allowing electromagnetic and electric waves generated in an electric or electronic device to be conducted outside.

BACKGROUND ART

With the rapid developments in semiconductor and digital technologies, electric and electronic devices, as well as intelligence devices, have become much more functional and miniaturized. However, those devices often react to minute interferences caused by electromagnetic waves and thus operate poorly. Therefore, in order to ensure that the device preforms optimally and achieves product reliability, there is a need in the art for a method of conducting the electromagnetic waves, which are generated in the electric and electronic devices, outside.

DISCLOSURE OF INVENTION

Technical Problem

When conducting radiation test of EMI and static electricity radiation test among the adaptability test of electromagnetic wave for systems, the frame grounds on various cards cannot be conducted outside. Additionally, since the portion coupling each card to the shelf is shorted, the card cannot be grounded.

Technical Solution

It is, therefore, an objective of the present invention to provide an in/ejector and a shelf structure grounded to a frame ground of a card. According to the in/ejector and shelf structure of the present invention, the electromagnetic and electric waves are conducted outside by connecting a guide supporter of the shelf to the frame ground of the card, and further connecting an inventive structure (i.e., coupling protrusions formed on the in/ejector) to finger strips formed on the guide supporter of the shelf.

The in/ejector and shelf structure according to the present invention can conduct the electromagnetic and electric waves generated in the electric or electronic devices outside. The in/ejector and shelf structure comprises:

a shelf having a frame, a guide rail and a guide supporter, wherein the frame and the guide rail are established at a given spacing in front and rear portions of upper and lower ends thereof, respectively, in order to provide a framework, and wherein the guide supporter has a common conductivity formed in an inside of both upper and lower parts thereof;

a card including a frame ground and a stiffener, wherein the frame ground having conductivity is formed on upper and lower parts thereof, and wherein the stiffener having a rectangular shape is formed on a front part thereof, and wherein the card is mounted on the shelf; and an in/ejector for fixing the card on the shelf, wherein said in/ejector is coupled to upper and lower parts of the stiffener and is grounded to the guide supporter and the frame ground.

Advantageous Effects

According to the present invention comprising an in/ejector and a shelf structure grounded to a frame ground of a card, communication interference caused by unnecessary electromagnetic waves generated in the electronic device, electric waves of other types of devices and external electric waves can be reduced, thus mitigating the loss of lives and property damage resulting from incorrect operations.

BRIEF DESCRIPTION OF THE DRAWINGS

These drawings depict only the preferred embodiments of the present invention and should not be considered as limitations of its scope. These as well as other features of the present invention will become more apparent upon reference to the drawings in which:

FIG. 1 illustrates in/ejectors and cards of the present invention which are coupled to each other and are mounted on a shelf.

FIG. 2 is a cross-sectional view along line A-A' of FIG. 1 in which the in/ejector and shelf structure of the present invention are grounded to a frame ground of the card.

FIG. 3 illustrates an in/ejector and a guide supporter of the present invention.

FIG. 4 illustrates the coupling pattern between an in/ejector and a card of the present invention.

FIG. 5 illustrates a side view of the card coupled to the in/ejector of FIG. 2 prior to being mounted on a guide supporter of the shelf.

FIG. 6 illustrates a side view of the card coupled to the in/ejector of FIG. 2 that is mounted on a guide supporter of the shelf.

BEST MODE FOR CARRYING OUT THE INVENTION

Now, referring to the attached drawings, an in/ejector and shelf structure grounded to a frame ground of a card according to one embodiment of the present invention will be described.

FIGS. 1 and 2 illustrate an in/ejector and shelf structure grounded to a frame ground of a card according to one embodiment of the present invention. An in/ejector and shelf structure grounded to a frame ground of the present invention comprises a shelf 100, a card 200 and an in/ejector 300.

A shelf 100 has frames and guide rails in front and rear portions of upper and lower ends thereof. Further, the frames and guide rails are established at a given spacing. Guide supporters 110 are formed on 4 corners of the shelf 100. The card 200 and in/ejector 300 are grounded through the guide supporters 110.

Moreover, as shown in FIG. 3, the guide supporter 110 is comprised of a body 120, a finger strip 140 and a fixing protrusion 150. Bodies 120 formed on 4 corners of shelf 100 make the frame ground 210 of card 200 and in/ejector 300 to be grounded.

The elastic finger strip 140 is shaped as '⊂' and is formed in guide groove 130 of body 120. It fixes and grounds the in/ejector 300.

Fixing protrusion 150 is formed on one side of body 120 by a given size, and coupled to fixing groove 321 of in/ejector 300.

As shown in FIG. 4, the card 200 is mounted on the shell 100. This is achieved by the frame ground 210 having conductivity formed on upper and lower parts of the card 200 and stiffener 220 having a rectangular shape formed on a front part thereof. The frame ground 210 formed on the card 200 comes in contact with an upper part of the guide supporter 110 of shelf 100 so as to be grounded. The stiffener 220 is coupled to a base 330 of the in/ejector 300 so as to be grounded.

Moreover, the in/ejector 300 is coupled to the stiffener 220 of the card 200 so that the card becomes fixed on the shelf. The in/ejector 300 is comprised of a locker 310, a body 320 and a base 330.

A lever is formed on the upper part of the locker 310 so that the card 200 can be self-erected vertically.

The body 320 is mounted beneath the locker 310. The fixing groove 321 formed on the lower part of the body 320 is fixed to a fixing protrusion 150 of the body 320. The base 330 is mounted on the body 320 and coupling protrusion 331, which has a given size formed on the lower part of the base 330, is fixed to the finger strip 140 of the guide supporter 110. This is so that the base can be grounded.

Referring now to FIGS. 5 and 6, the method of coupling an in/ejector to a shelf structure according to one embodiment of the present invention, as depicted above, will be described below.

First, in order to mount the card 200 on the shelf 100, the in/ejector 300 coupled to the card 200 should be pushed into the shelf 100 as shown in FIG. 5.

Then, in the card 200 and in/ejector 300 mounted in the shelf (shown in FIG. 6), the conductive frame ground 210 formed in upper and lower parts of the card 200 is connected to an upper part of the body 120 of the guide supporter 110. The guide supporter 110 has common conductivity and is formed in upper and lower parts of the shelf 100.

Additionally, a coupling protrusion 331 formed on a lower part of the base 330 of an in/ejector 300 is fixed to the finger strip 140 formed in guide groove 130 of the body 120, thereby being grounded. The fixing groove 321 formed on a lower part of the body 320 of an in/ejector 300 is fixed to the fixing protrusion 150 formed on one side of the body 120 of the guide supporter 110.

Therefore, the frame ground 210 of the card 200 and in/ejector 300 are fixed to the guide supporter 110 of the shelf 100 and become grounded so that electromagnetic and electric waves generated in the card 200 can be conducted to the guide supporter 110 of shelf 100 through the frame ground 210.

Few embodiments of the present invention are described herein. However, the present invention is not limited to those embodiments and various modifications can be conducted within the spirit of the present invention.

INDUSTRIAL APPLICABILITY

According to an in/ejector and shelf structure grounded to a frame ground of a card of the present invention, communication interference caused by unnecessary electromagnetic waves generated in the electronic device, electric waves of other types of devices and external electric waves can be reduced, thereby mitigating the loss of lives and property damage resulting from incorrect operations. Additionally, in conducting radiation test of EMI and static electricity radiation test among the adaptability test of electromagnetic wave for systems, electromagnetic waves can be reduced significantly so that the device can operate normally under static electricity when the frame grounds on various cards are conducted outside.

The invention claimed is:

1. An in/ejector and shelf structure grounded to a frame ground of a card, said structure comprising:
    a shelf having a guide supporter, wherein the guide supporter has a common conductivity formed in an inside of both upper and lower parts of the shelf, and wherein the guide supporter comprises an elastic conductive element;
    a card including a frame ground and a stiffener, wherein the frame ground having conductivity is formed on upper and lower parts of the card, and wherein the stiffener having a rectangular shape is formed on a front part of the card, and wherein the card is mounted on the shelf; and
    an in/ejector for fixing the card on the shelf, wherein the in/ejector is coupled to upper and lower parts of the stiffener and is grounded to the frame ground, and grounded to the guide supporter via the elastic conductive element.

2. The in/ejector and shelf structure grounded to the frame ground of the card according to claim 1, wherein the elastic conductive element comprises a finger strip having elasticity formed on a guide groove and shaped as 'c', the finger strip fixing the in/ejector on the guide groove and causing the in/ejector to be grounded, and wherein the guide supporter further comprises:
    a body formed on the upper and lower ends of the shelf and having the guide groove, the guide groove causing the frame ground of the card embedded on the shelf and the in/ejector to be grounded; and
    a fixing protrusion formed on one side of the body having a prescribed size, wherein the in/ejector is coupled to the fixing protrusion.

3. The in/ejector and shelf structure grounded to the frame ground of the card according to claim 2, wherein the in/ejector comprises:
    a locker having a lever formed on the upper part of the locker, wherein the lever causes the card to be vertically self-erectable on the shelf;
    a body mounted on the lower part of the locker having a fixing groove shaped as a groove on the lower part of the body, wherein the body is fixed to the guide supporter having the fixing protrusion; and
    a base established on one side of the lower part of the body having a coupling protrusion on the lower part of the base, wherein the base causes the guide supporter having the finger strip to be grounded.

* * * * *